(12) United States Patent
Dupuis et al.

(10) Patent No.: US 9,735,145 B2
(45) Date of Patent: Aug. 15, 2017

(54) ELECTROSTATIC DISCHARGE PROTECTION FOR A BALUN

(71) Applicant: Silicon Laboratories Inc., Austin, TX (US)

(72) Inventors: Timothy J. Dupuis, Austin, TX (US); Ravi K. Kummaraguntla, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 99 days.

(21) Appl. No.: 14/625,453

(22) Filed: Feb. 18, 2015

(65) Prior Publication Data

US 2016/0241024 A1    Aug. 18, 2016

(51) Int. Cl.
*H02H 9/04* (2006.01)
*H01L 27/02* (2006.01)
*H01L 23/00* (2006.01)

(52) U.S. Cl.
CPC .......... *H01L 27/0266* (2013.01); *H01L 24/49* (2013.01); *H01L 24/85* (2013.01); *H01L 27/0255* (2013.01); *H02H 9/046* (2013.01); *H01L 2224/48265* (2013.01); *H01L 2924/00014* (2013.01); *H01L 2924/1203* (2013.01); *H01L 2924/1206* (2013.01); *H01L 2924/1304* (2013.01); *H01L 2924/14* (2013.01); *H01L 2924/141* (2013.01)

(58) Field of Classification Search
CPC ........ H01L 27/0266; H01L 24/49; H02H 9/04
USPC .......................................................... 361/38
See application file for complete search history.

(56) References Cited

U.S. PATENT DOCUMENTS

| | | | |
|---|---|---|---|
| 7,009,308 B1* | 3/2006 | Jin | H01L 23/60 257/690 |
| 7,010,279 B2 | 3/2006 | Rofougaran | |
| 7,391,596 B2 | 6/2008 | Khorram | |
| 8,576,026 B2 | 11/2013 | Liu et al. | |
| 2004/0102175 A1 | 5/2004 | Rofougaran | |
| 2007/0080736 A1* | 4/2007 | Castaneda | H03F 1/565 327/268 |

(Continued)

OTHER PUBLICATIONS

Ker, Ming-Dou and Hsiao, Yuan-Wen, "ESD Protection Design With Low-Capacitance Consideration for High-Speed/High-Frequency I/O Interfaces in Integrated Circuits," Recent Patents on Engineering 2007, pp. 131-145.

(Continued)

*Primary Examiner* — Scott Bauer
(74) *Attorney, Agent, or Firm* — Zagorin Cave LLP

(57) ABSTRACT

A die is mounted in an integrated circuit package. The die includes a balun circuit and an electrostatic discharge (ESD) circuit coupled to a ground of the integrated circuit die. The package has a first output pin coupled to a first terminal of the balun and has a second output pin coupled to a second terminal of the balun through first and second bond wires. The second output pin is connected to board ground. A third bond wire is disposed between the second package terminal and the ESD circuit to provide a safe discharge path through the third bond wire for ESD events affecting the first and second output terminals. Thus, a charge that builds up involving one of the output terminals coupled to the balun can be safely dissipated.

17 Claims, 3 Drawing Sheets

(56) References Cited

U.S. PATENT DOCUMENTS

| | | | |
|---|---|---|---|
| 2007/0152770 A1* | 7/2007 | Mondal | H03H 7/42 |
| | | | 333/25 |
| 2007/0165345 A1 | 7/2007 | Woo | |
| 2009/0096532 A1* | 4/2009 | El Rai | H03F 3/195 |
| | | | 330/301 |
| 2009/0161281 A1 | 6/2009 | Maggiolino | |
| 2010/0033253 A1* | 2/2010 | Narathong | H03F 1/42 |
| | | | 330/301 |
| 2010/0283700 A1* | 11/2010 | Rajanish | H01L 23/66 |
| | | | 343/793 |
| 2011/0098009 A1* | 4/2011 | Marholev | H04B 5/0093 |
| | | | 455/78 |
| 2011/0215880 A1* | 9/2011 | Roufoogaran | H03H 7/42 |
| | | | 333/4 |
| 2011/0298051 A1* | 12/2011 | Khieu | H01L 27/0251 |
| | | | 257/355 |
| 2016/0241024 A1 | 8/2016 | Dupuis et al. | |

OTHER PUBLICATIONS

Mak, Pui-In, et al., "An open-source-input, ultra-wideband LNA with mixed-voltage ESD protection for full=band (17—to-1700 MHz) mobile TV tuners," IEEE International Symposium on Circuits and Systems, (ISCAS), May 18-21, 2008, pp. 668-671.

Yu, Tiku and Rebeiz, G.M., "A 4-channel 24-27 GHz CMOS differential phased-array receiver," IEEE Radio Frequency Integrated Circuits Symposium, (RFIC), Jun. 7-9, 2009, pp. 455-458.

Wang, H., et al. "A low-power ESD-protected 24 GHz receiver front-end with π-type input matching network," IEEE International Symposium on Circuits and Systems (ISCAS), May 15-18, 2011, pp. 2877-2880.

\* cited by examiner

ELECTROSTATIC DISCHARGE PROTECTION FOR A BALUN

BACKGROUND

Field of the Invention

This invention relates to electrostatic discharge (ESD) and ESD protection associated with baluns.

Description of the Related Art

FIG. 1 illustrates a portion of a radio frequency (RF) system that includes an integrated circuit 101 with an output stage 103 and a balun 105. Baluns may be used to convert single-ended signals into differential signals or differential signals into single ended signals. Baluns may also be used to reject even harmonics and as band-select filters. Bond wires 107 couple the balun to an antenna 109 through package output terminals (pins) 108 and 110. In the example of FIG. 1, the balun comprises a transformer that includes an input coil 115 and an output coil 117. The number of turns in the illustrated RF system is the same in each coil although the ratio of turns in each coil can be different according to system requirements.

The signals on terminals 108 and 110 are supplied to front-end module (FEM) 112, which in turn drives antenna 109. Typically, an FEM includes an input matching network to match the impedance to the driver power amplifier (PA), and/or includes another PA to get more power gain, and/or another low noise amplifier (LNA) to improve the noise figure of the received signal, and/or a matching network to match to the antenna 109.

The bond wires 107 include an inductance that provides impedance at high frequencies. Thus, significant voltage swings occur on terminals outp and outn as part of normal RF operation, e.g., a voltage swing of between −4 and +4 volts. Conventional ESD protection circuits operate at frequencies comparable with normal balun operation and can interfere with balun operation. Thus, a conventional ESD protection circuit could respond to balun voltage/current swings as an ESD event and clamp to ground. That is undesirable since it will result in excessive leakage to ground during normal operation and possibly power loss.

Since ESD events can impact package terminals 108 and 110, avoiding ESD damage due to ESD events for the package terminals associated with the balun is needed, while still ensuring the ESD protection avoids interference with normal operation.

SUMMARY OF EMBODIMENTS OF THE INVENTION

Accordingly, in one embodiment, an apparatus includes a balun circuit including an input coil and an output coil disposed on an integrated circuit die. A first bond wire is coupled to a first terminal of the balun circuit and is coupled to a first output terminal of an integrated circuit package housing the integrated circuit die. A second bond wire is coupled to a second terminal of the balun circuit and is coupled to a second output terminal on the integrated circuit package, the second output terminal for coupling to a ground of a printed circuit board on which the integrated circuit package is mounted. A third bond wire is coupled to the second output terminal and is coupled to an electrostatic discharge (ESD) circuit on the integrated circuit die.

In another embodiment, a method is provided for providing electrostatic discharge protection for a package terminal of an integrated circuit package. The package terminal is coupled to a first terminal of a balun circuit through a bond wire, the first terminal also being coupled to a ground of a printed circuit board on which the integrated circuit is mounted. The method includes providing a low impedance path from the package terminal to an integrated circuit ground through a second bond wire coupled to the first terminal and coupled to an electrostatic discharge (ESD) circuit disposed between the bond wire and the integrated circuit ground, responsive to a voltage being above a predetermined threshold at the package terminal.

In still another embodiment, an apparatus includes a printed circuit board having a first ground. An integrated circuit package is mounted on the printed circuit board. A die is mounted in the integrated circuit package. The die includes a balun circuit having an input coil and an output coil. The die also includes an electrostatic discharge (ESD) circuit coupled to a ground of the integrated circuit die. A first bond wire is disposed between a first terminal of the balun circuit and a first package terminal of the integrated circuit package. A second bond wire is disposed between a second terminal of the balun circuit and a second package terminal on the integrated circuit package. The second package terminal is coupled to the first ground on the printed circuit board. A third bond wire is disposed between the second package terminal and the ESD circuit.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
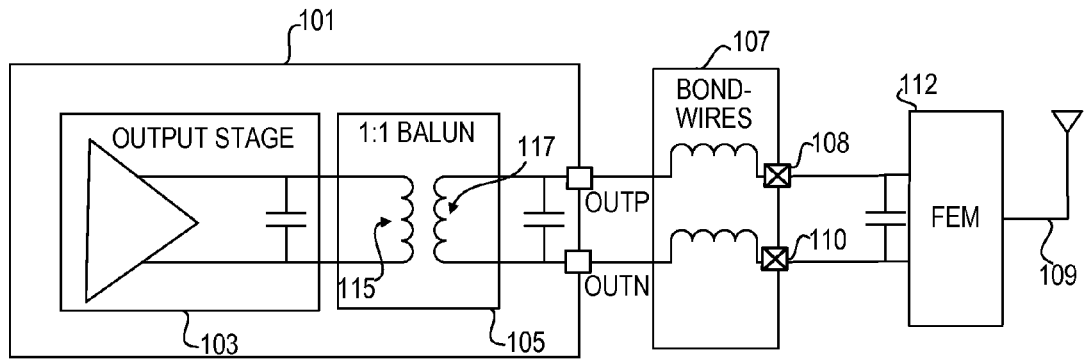
FIG. 1 illustrates an RF circuit including a balun.
Figure 2:
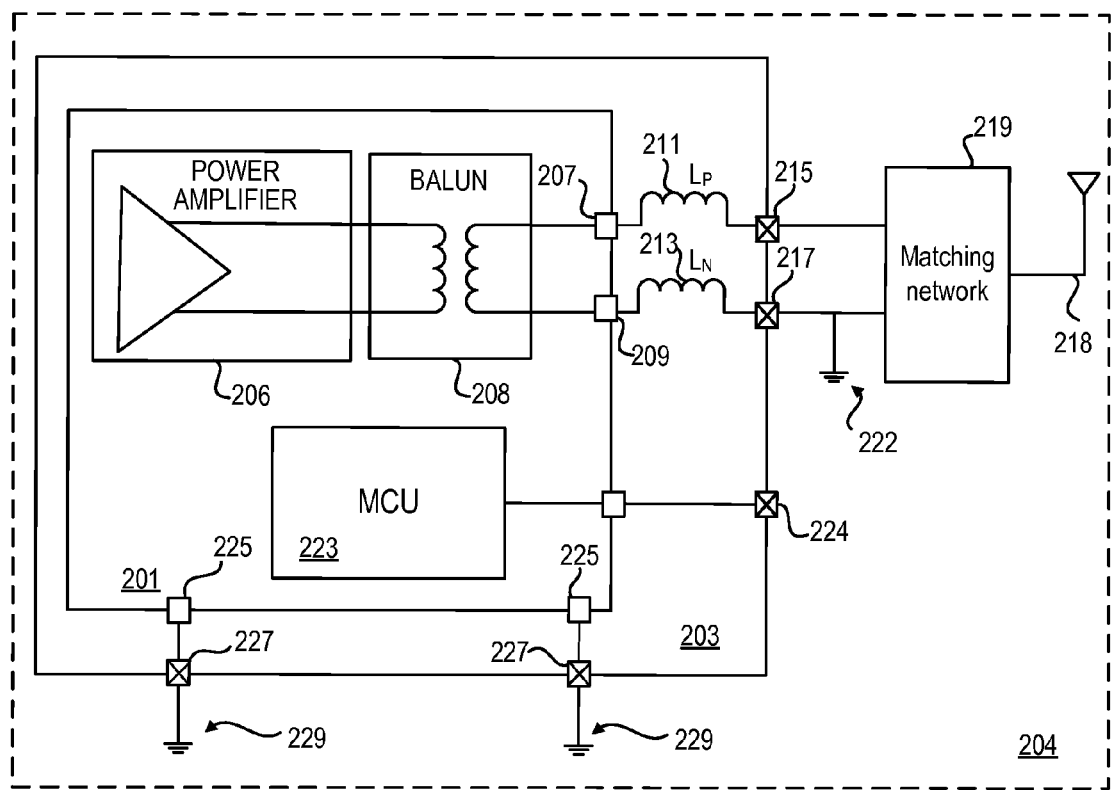
FIG. 2 illustrates an RF circuit including a balun on a die with an MCU.

Referring to FIG. 2, a system includes a die 201 mounted in a package 203, which is mounted on a printed circuit board 204. The die 201 includes a power amplifier 206 supplying the balun 208 with an RF signal. The output coil of the balun is coupled to two die pads 207 and 209, which in turn are coupled through bond wires 211 and 213 to package terminals (pins) 215 and 217. The bond wires shown in FIG. 2 have an inductance $L_P$ on the positive balun output and an inductance $L_N$ on the negative balun output resulting in impedance at high frequencies. The package pin 215 is coupled to the antenna 218 through other circuitry mounted on the printed circuit board such as matching network 219 The package pin 217 is coupled to board ground 222 of the printed circuit board 204.

The die 201 also includes digital logic such as a microcontroller unit (MCU) 223. The die 201 includes multiple die pads 225 coupling chip ground through package pins 227 to board grounds, such as board grounds 229. While two such ground connections are shown, the die 201 may have additional ground connections.

For the RF portion of the system, a significant amount of RF current flows to the load represented by antenna 218 through the path including bond wire 211. The current returns to the die through the ground path including bond wire 213. To avoid noise and coupling issues for digital logic on the die, it is desirable to avoid having the RF current return to the die through other grounds (such as through pins 227) utilized by the digital logic. Thus, it is desirable to isolate the RF path to ensure current does not return through the other grounds. One way to accomplish that isolation is to provide the ground connection for the balun off die and utilize a board ground 222 instead of a chip ground. Not tying the balun to chip ground (and instead to board ground) isolates the power amplifier (PA) from the MCU and other circuitry on the chip. Otherwise, PA currents could be quite large and could cause unwanted interference with the MCU and the other circuitry.

However, isolating the RF ground for the balun and the digital ground can have ESD implications. There is no built-in ESD path between the positive 215 (or the negative output 217) and another input or output terminal 224 on the integrated circuit package 203. If pin 215 (or 217) is ESD stressed relative to 224, a large voltage (e.g. several thousand volts) can build between pins and an uncontrolled spark discharge can occur. Since there is no safe place for the energy to be dissipated, since pin 215 (217) is not connected to chip ground, damage could occur on internal components in die 201. Accordingly, ESD protection is required for the balun pins shown in FIG. 2. Due to the high frequency RF signals and the inductance on the bond wires, voltage swings on the bond wires, in one embodiment, can be expected to range from −4V to +4V. That makes it difficult to connect ESD protection circuitry directly to pads 207 or 209. Note that the voltage swings on bond wires 211 and 213 may not be equal to each other but both could range from, e.g., −4V to +4V.

Figure 3:
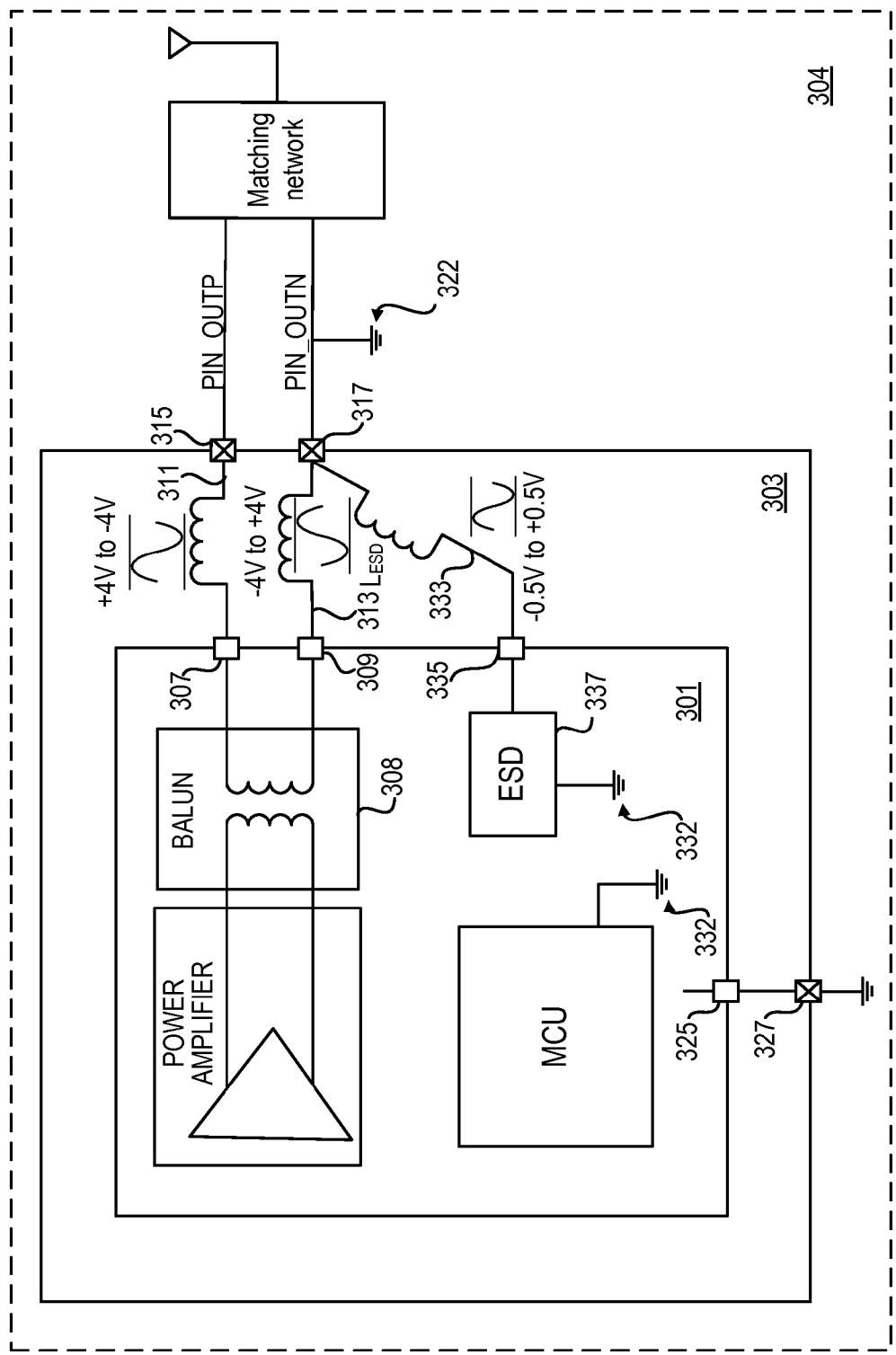
FIG. 3 illustrates an embodiment providing ESD protection for package pins associated with the balun.

Referring to FIG. 3, an embodiment provides ESD protection for the RF system shown in which a single ended RF signal is provided by die 301 from the balun 308. As in FIG. 2, die 301 is mounted in package 303, which in turn is mounted on printed circuit board 304. Balun 308 supplies pads 307 and 309. Bond wires 311 and 313 connect pads 307 and 309 to package pins 315 and 317. The bond wires include inductance $L_P$ and $L_N$ where P and N refer to the balun positive and negative outputs, respectively. The inductance provides impedance at high frequencies. The negative output pin 317 is grounded at board ground 322. In addition, in order to provide ESD protection, another bond wire 333 connects package pin 317 to another pad 335 on die 301. The pad 335 is also connected to ESD circuitry 337. The voltage swings present on the positive and negative bond wires 311 and 313 still range, in one embodiment, from −4V to +4V. However, the voltage swing at pad 335 is approximately an order of magnitude less, and ranges, e.g., from −0.5V to +0.5V due to significantly less current on the bond wire 333. Thus, conventional ESD clamps can be used for ESD circuitry 337, which is coupled to pad 335. ESD circuit 337 is coupled to chip ground 332. The chip ground in system shown in FIG. 3 is typically coupled through multiple pads 325 to multiple package pins (only one pad and package pin is shown).

Thus, ESD protection is provided for package pin 317. In addition, an ESD event on package pin 315 would also be protected as a DC path is provided through the outer coil of the balun 306, through bond wire 313 and bond wire 333 to ESD protection circuit 337. With the approach of FIG. 3, a safe path for energy dissipation is provided.

Figure 4:
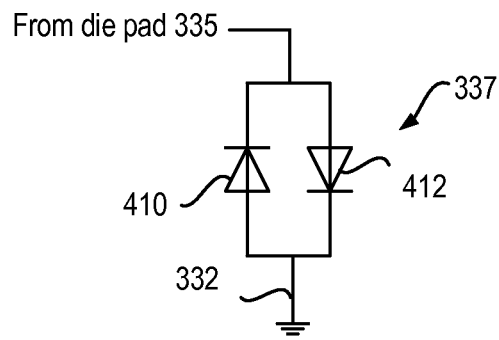
FIG. 4 illustrates an embodiment of an ESD protection circuit.

FIG. 4 shows an exemplary diode clamp that may be used in ESD circuit 337. In the embodiment illustrated in FIG. 4, the ESD circuit 337 includes a first diode 410 configured to allow current to flow in a first direction and a second diode 412 configured to allow current to flow in the reverse direction. Thus, the configuration may be referred to as anti-parallel. Note that although only a single diode 410 is shown for convenience, the diode 410 represents a suitable number of serially connected diodes so an appropriate diode drop is achieved before the diode string 410 turns on. The diode 410 turns on when the voltage at die pad 335 drops below a negative threshold voltage to forward bias the diode(s) 410. For example, the negative threshold voltage may be −1 to −2 V. Similarly, for diode 412, although only a single diode 412 is shown for convenience, the diode 412 represents a suitable number of serially connected diodes so an appropriate diode drop is achieved before the diode 412 turns on. The diode(s) 412 turn on when the voltage at pad 335 rises above a positive threshold voltage to forward bias the diode(s) 412. For example, the positive threshold voltage may be 1V to 2 V. The particular positive and negative threshold voltages used depend on the particular system implementation.

During normal operation, the ESD circuit 337 isolates the balun 308 from chip ground and the rest of the system because the diode(s) remain in the off state. When one of the diode(s) 410 or 412 turns on in response to an ESD event, output pin 315 (317) is coupled to a suitable reference voltage shown as ground 332 in the illustrated embodiment through a low impedance path through the diode circuit.

Figure 5:
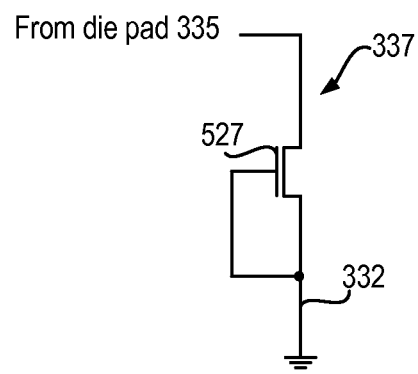
FIG. 5 illustrates an embodiment of an ESD protection circuit.

While the ESD circuit 337 is shown in FIG. 4 as a diode circuit, FIG. 5 illustrates a level-triggered embodiment in which the ESD circuit 337 is implemented using a snapback transistor. In the embodiment illustrated in FIG. 5 transistor 527 is a grounded gate NMOS transistor. In operation, when an ESD event occurs, the NMOS transistor 527 enters bipolar operation during which voltage across the device collapses and high current is conducted both along the surface and in the bulk. In this mode NMOS transistor 527 provides a low resistance path between the pin 317 (or 315) and the ground 332. Otherwise, with no ESD event, transistor 527 isolates the pin 317 (315) and thus the balun 308 from chip ground 332. While several embodiments of the ESD circuit 309 have been illustrated, other suitable circuits may be utilized that respond to the positive and negative threshold voltages to output pins associated with the balun to the reference voltage to thereby prevent an ESD event from resulting in damage.

Thus, various aspects have been described relating ESD protection for a balun. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. An apparatus comprising:
   a balun circuit including an input coil and an output coil disposed on an integrated circuit die;
   a first bond wire coupled to a first terminal of the balun circuit through a first die pad and coupled to a first output terminal of an integrated circuit package housing the integrated circuit die;
   a second bond wire coupled to a second terminal of the balun circuit through a second die pad and coupled to a second output terminal on the integrated circuit package, the second output terminal for coupling to a first ground, the first ground being a board ground of a printed circuit board on which the integrated circuit package is mounted; and a third bond wire coupled to the second output terminal and to an electrostatic discharge (ESD) circuit on the integrated circuit die through a third die pad, wherein the ESD circuit is coupled to a second ground, the second ground being an integrated circuit ground on the integrated circuit die; and wherein voltage swings on the first and second bond wires are approximately an order of magnitude greater than a voltage swing at the third die pad.

2. The apparatus as recited in claim 1 further comprising a microcontroller disposed on the integrated circuit die.

3. The apparatus as recited in claim 1 wherein the integrated circuit die further comprises a power amplifier circuit coupled to supply an amplified signal to the balun circuit.

4. The apparatus as recited in claim 1 wherein the ESD circuit comprises a diode.

5. The apparatus as recited in claim 1, wherein the balun circuit comprises an input coil and an output coil disposed in the integrated circuit die.

6. The apparatus as recited in claim 1 further comprising the printed circuit board on which the integrated circuit package containing the integrated circuit die is mounted.

7. A method of providing electrostatic discharge protection for a package terminal of an integrated circuit package and for a die mounted in the integrated circuit package, the method comprising:

coupling a first terminal of a balun circuit through a bond wire to the package terminal and through the package terminal to a ground of a printed circuit board on which the integrated circuit package is mounted; and responsive to a voltage being above a predetermined threshold at the package terminal, providing a low impedance path from the package terminal to an integrated circuit ground on the die through a second bond wire coupled to the package terminal and coupled through a die pad of the die to an electrostatic discharge (ESD) circuit disposed between the second bond wire and the integrated circuit ground, a voltage on the die pad being approximately an order of magnitude less than the predetermined threshold when the low impedance path is provided.

8. The method as recited in claim 7 further comprising:

responsive to the voltage being below a second predetermined threshold at the package terminal of the integrated circuit package, providing a low impedance path from the package terminal to the integrated circuit ground.

9. The method as recited in claim 7 wherein providing the low impedance path comprises turning on a diode circuit in the ESD circuit responsive to the voltage at the package terminal of an integrated circuit package being above the predetermined threshold to thereby provide the low impedance path.

10. The method as recited in claim 7, wherein the balun circuit is disposed in the die.

11. The method as recited in claim 9 further supplying the balun circuit with an amplified signal from a power amplifier.

12. The method as recited in claim 7 further comprising during normal operation the voltage at the package terminal is below the predetermined threshold.

13. An apparatus comprising:

a printed circuit board having a first ground;

an integrated circuit package mounted on the printed circuit board;

a die mounted in the integrated circuit package, the die including, a balun circuit including an input coil and an output coil;

electrostatic discharge (ESD) circuit coupled to a ground of the die;

a first bond wire disposed between a first terminal of the balun circuit and a first package terminal of the integrated circuit package;

a second bond wire disposed between a second terminal of the balun circuit and a second package terminal on the integrated circuit package, the second package terminal coupled to the first ground of the printed circuit board;

a third bond wire disposed between the second package terminal and the ESD circuit;

a first output die pad coupled between the first terminal of the balun circuit and the first bond wire;

a second output die pad coupled between the second terminal of the balun circuit and the second bond wire;

a third output die pad coupled between the third bond wire and the ESD circuit; and wherein voltage swings on the first and second bond wires are approximately an order of magnitude greater than a voltage swing at the third output die pad.

14. The apparatus as recited in claim 13 further comprising a microcontroller disposed on the die.

15. The apparatus as recited in claim 13 wherein the die further comprises a power amplifier coupled to supply an amplified signal to the balun circuit.

16. The apparatus as recited in claim 13 wherein the ESD circuit comprises one or more diodes.

17. The apparatus as recited in claim 13 wherein the ESD circuit comprises a snap back transistor.

* * * * *